(12) United States Patent
Yoneda et al.

(10) Patent No.: US 9,484,294 B2
(45) Date of Patent: Nov. 1, 2016

(54) SEMICONDUCTOR DEVICE AND METHOD OF MANUFACTURING THE SAME (71) Applicant: Mitsubishi Electric Corporation, Tokyo (JP)

(72) Inventors: Yutaka Yoneda, Tokyo (JP); Hidetoshi Ishibashi, Tokyo (JP); Masao Kikuchi, Tokyo (JP); Tatsunori Yanagimoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/830,248

(22) Filed: Aug. 19, 2015

(65) Prior Publication Data
US 2016/0133712 A1 May 12, 2016

(30) Foreign Application Priority Data

Nov. 12, 2014 (JP) ................. 2014-229486

(51) Int. Cl.
*H01L 23/498* (2006.01)
*H01L 23/00* (2006.01)
*H01L 23/48* (2006.01)
*H01L 23/373* (2006.01)

(52) U.S. Cl.
CPC ........ *H01L 23/49838* (2013.01); *H01L 23/481* (2013.01); *H01L 24/32* (2013.01); *H01L 24/83* (2013.01); *H01L 23/3735* (2013.01); *H01L 2224/32225* (2013.01); *H01L 2224/83205* (2013.01)

(58) Field of Classification Search
None
See application file for complete search history.

(56) References Cited

U.S. PATENT DOCUMENTS

2005/0221177 A1* 10/2005 Amagai .................. H01M 2/20
429/186

FOREIGN PATENT DOCUMENTS

| EP | 1703554 A2 | 9/2006 |
|----|-----------|--------|
| EP | 1703554 A3 | 3/2009 |
| JP | 2005-259880 A | 9/2005 |
| JP | 2006-253516 A | 9/2006 |
| JP | 2010-010537 A | 1/2010 |
| JP | 4524570 B2 | 8/2010 |

* cited by examiner

*Primary Examiner* — Yasser A Abdelaziez
(74) *Attorney, Agent, or Firm* — Studebaker & Brackett PC (57) ABSTRACT

A semiconductor device of the present invention includes a bonding target and an electrode terminal bonded to the bonding target. The electrode terminal and the bonding target are bonded by ultrasonic bonding at a bonding surface to be subjected to bonding. The electrode terminal includes a penetrating hollow part surrounded on at least two sides by the bonding surface.

9 Claims, 5 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, particularly to a semiconductor device for power applications.

2. Description of the Background Art

In a conventional power semiconductor device, particularly a large-current power semiconductor device, an electrode terminal is required to be bonded in a large area to cause large current to flow effectively. Thus, solder has been used for bonding of the electrode terminal (see Japanese Patent Application Laid-Open No. 2006-253516). Meanwhile, in response to increase in the temperature of an environment where the power semiconductor device is used, solder bonding conventionally used has potentially made it impossible to satisfy requested reliability. According to the conventional solder bonding, if the power semiconductor device includes an insulating substrate with a ceramic plate and conductive patterns formed on opposite surfaces of the ceramic plate and a base plate bonded with solder to the insulating substrate, overheating caused during solder bonding of the electrode terminal may remelt the solder used for bonding between the base plate and the insulating substrate. This has made it impossible to use solder types of melting points close to each other to require use of multiple solder types, causing the problem of complicated manufacturing process.

The aforementioned problems may be solved by a method of bonding the electrode terminal ultrasonically to a conductive pattern on the insulating substrate. Ultrasonic bonding is solid-phase bonding and does not require a heating step. Thus, during bonding of the electrode terminal, the electrode terminal can be bonded in a large area without remelting the solder used for bonding between the base plate and the insulating substrate. Additionally, ultrasonic bonding can enhance the reliability of a bonded part compared to solder bonding.

According to ultrasonic bonding, a material to be bonded is bonded by being caused to vibrate ultrasonically while being pressurized through an ultrasonic horn. At this time, the ultrasonic bonding breaks an oxide film on a surface to be bonded to push the oxide film aside to the outside of a bonded part. In response to increase in the area of the bonded part, the oxide film in the center of the bonded part is not pushed aside to the outside of the electrode terminal but it remains in the bonding surface. Thus, a part of the bonding surface with the remaining oxide film is left unbonded. If the oxide film in the center of the terminal can be pushed aside efficiently to the outside of the bonded part, the unbonded part in the center of the terminal can be removed to enhance bonding performance. This can reduce nonuniformity of the quality of the bonded part.

The following technique relating to ultrasonic bonding has been disclosed. A projection is formed on a bonding end surface of an electrode terminal to be bonded to a semiconductor element mounted on an insulating substrate. The projection has a height at least of a level not falling below the thickness of an oxide film formed on a surface of a bonding counterpart. Then, a bonding surface is ultrasonically bonded to a conductive pattern or the semiconductor element.

According to ultrasonic bonding, a material to be bonded is bonded by being caused to vibrate ultrasonically while being pressurized through an ultrasonic horn. An electrode terminal of a semiconductor device is bonded in a large area in one ultrasonic bonding. Thus, an oxide film generated on a surface of the material to be bonded or a contaminant such as dust, oil content or moisture content adhering to the surface of the material to be bonded cannot be pushed aside to the outside of a bonded part during ultrasonic bonding to remain in a bonding surface. A part of the bonding surface with the remaining oxide film or contaminant is left unbonded. For this reason, if the oxide film in the center of the terminal can be pushed aside efficiently to the outside of the bonded part, the unbonded part in the center of the terminal can be removed to enhance bonding performance. This can reduce nonuniformity of the quality of the bonded part while achieving sufficient bonding performance even in a small area.

According to Japanese Patent Application Laid-Open No. 2005-259880, for example, a projection is formed on a bonding end surface of an electrode terminal to be bonded to a semiconductor element mounted on an insulating substrate. The projection has a height at least of a level not falling below the thickness of an oxide film formed on a surface of a bonding counterpart. Then, a bonding surface is ultrasonically bonded to a conductive pattern or the semiconductor element. By using an electrode terminal of this structure, the bonding end surface of the electrode terminal is placed over a bonding surface of a counterpart member and pressure and ultrasonic vibration are applied through an ultrasonic horn. This makes the projection formed in advance on a bonding surface of the electrode terminal slide on a surface of the counterpart member to split and break the oxide film. This forms direct contact with an intrinsic surface under the oxide film. If ultrasonic vibration is applied continuously in this state, plastic flow occurs on the bonding surface of the electrode terminal including the projection to enlarge a part where metal intrinsic surfaces adhere to each other. As a result, the electrode terminal and the counterpart member are ultrasonically bonded with sufficient bonding strength without being affected by the oxide film.

The aforementioned technique of Japanese Patent Application Laid-Open No. 2005-259880 achieves ultrasonic bonding with sufficient bonding strength. However, this technique does not enable a check to see whether the oxide film is removed from a central area of the terminal and resultant ultrasonic bonding has sufficient bonding strength as viewed from an appearance after the bonding. For this reason, if dust is attached to the outside of the projection and a part with the dust is left unbonded, for example, this unbonded part cannot be detected after the bonding.

SUMMARY OF THE INVENTION

It is an object of the present invention to provide a semiconductor device and a method of manufacturing the same capable of bonding an electrode terminal and a bonding target with high bonding strength and enabling observation of a bonded part as viewed from an appearance after bonding.

A semiconductor device of the present invention includes a bonding target and an electrode terminal bonded to the bonding target. The electrode terminal and the bonding target are bonded by ultrasonic bonding at a bonding surface to be subjected to bonding. The electrode terminal includes a penetrating hollow part surrounded on at least two sides by the bonding surface.

In the semiconductor device of the present invention, the penetrating hollow part is provided in advance in the electrode terminal before ultrasonic bonding is performed. By doing this, an oxide film or a contaminant existing on the bonding surface around the hollow part is pushed aside to the inside of the hollow part during the ultrasonic bonding. As a result, the oxide film is removed from the bonding surface during the ultrasonic bonding to form a bonded part with sufficient bonding strength. Additionally, the bonded part can be observed through the hollow part formed in the electrode terminal. This enables an appearance check to see whether the electrode terminal is bonded.

These and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device as a preferred embodiment of the present invention is described below by referring to the drawings. In the drawings, corresponding components or similar components are identified by the same sign. In the illustrations of the drawings, the respective sizes or reduction scales of corresponding components are independent among the drawings. As an example, referring to sectional views showing respective structures partially changed from each other, structures common between these sectional views may be shown in different sizes or reduction scales. According to an actual structure of the semiconductor device, the semiconductor device includes a larger number of components. However, to simplify the description, only those components required for the description are shown and other components (such as a power semiconductor element and a case) are omitted.

First Preferred Embodiment

Structure

Figure 1:
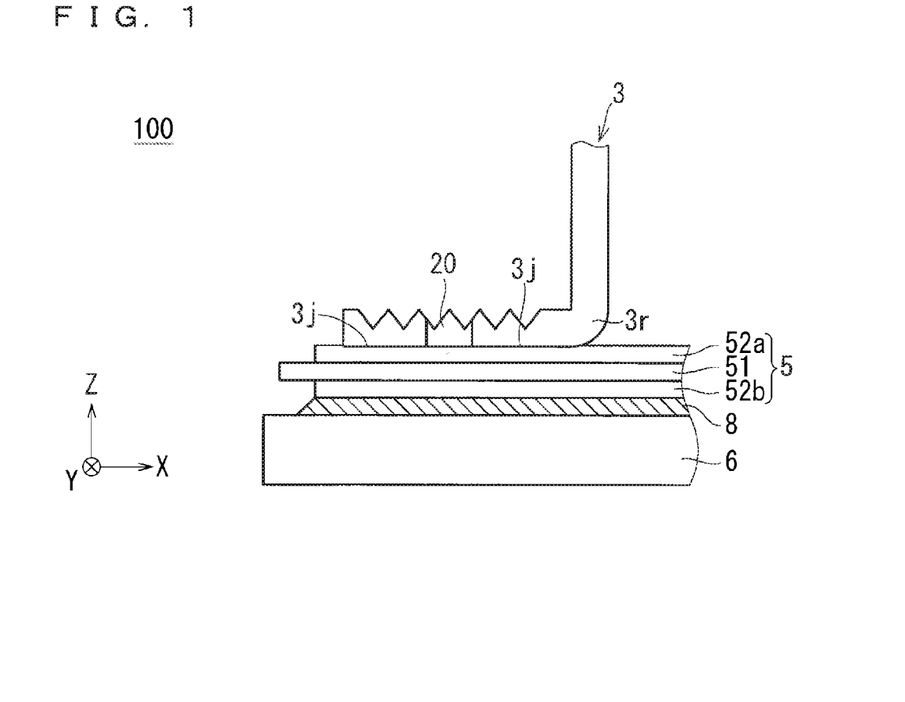
FIG. 1 is a partial sectional view of a semiconductor device according to a first preferred embodiment.
Figure 2:
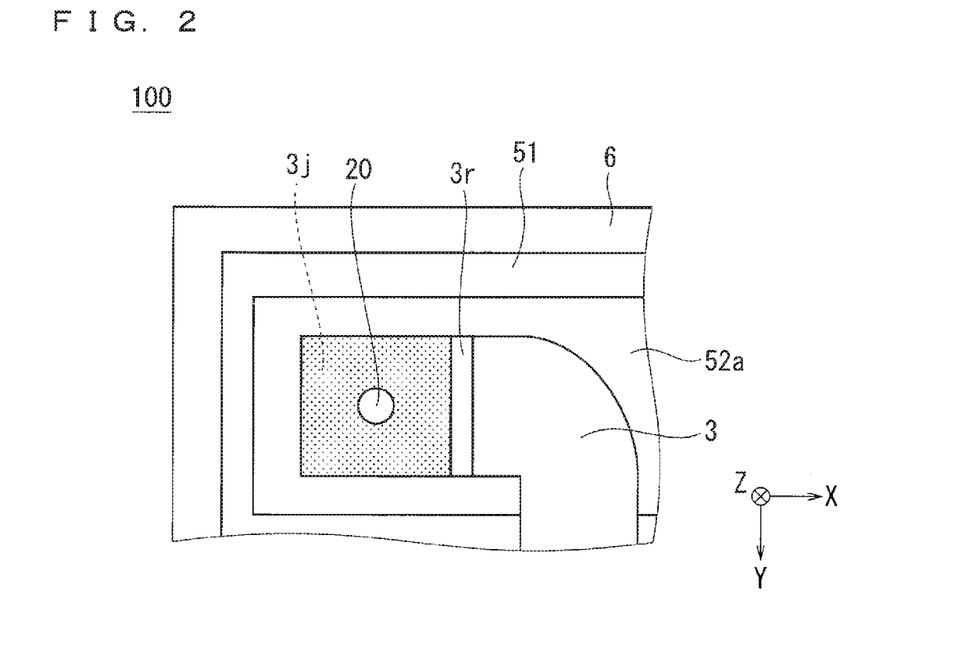
FIG. 2 is a partial plan view of the semiconductor device according to the first preferred embodiment.

FIG. 1 is a partial sectional view of a semiconductor device 100 according to a first preferred embodiment. FIG. 2 is a partial plan view of the semiconductor device 100. As shown in FIG. 1, the semiconductor device 100 includes an insulating substrate 5, a heat dissipating member 6, and an electrode terminal 3. The insulating substrate 5 includes an insulating plate 51, and a conductive pattern 52a and a conductive pattern 52b formed on opposite surfaces of the insulating plate 51. The heat dissipating member 6 is bonded with solder 8 to a heat dissipating surface side (side of the conductive pattern 52b) of the insulating substrate 5. The electrode terminal 3 is bonded to a circuit surface side (side of the conductive pattern 52a) of the insulating substrate 5 by ultrasonic bonding. The electrode terminal 3 and the conductive pattern 52a are ultrasonically bonded at a bonding surface 3j.

The electrode terminal 3 is a wiring member to electrically connect a power semiconductor element such as an insulated gate bipolar transistor (IGBT) and an external circuit. It is preferable that the electrode terminal 3 be made of metal of low electric resistance. Generally, the electrode terminal 3 is made of a cut plate or press-worked plate of Cu or Al, for example. The electrode terminal 3 has one end provided with a part bonded to the conductive pattern 52a. The electrode terminal 3 has an opposite end electrically connected to a different circuit member or an external circuit. The part of the electrode terminal 3 bonded to the conductive pattern 52a is provided with a through hole 20 formed as a penetrating hollow part. The through hole 20 is surrounded on all sides by the bonding surface 3j. Specifically, the electrode terminal 3 and the conductive pattern 52a are ultrasonically bonded around the through hole 20 in the electrode terminal 3.

The hollow part mentioned in the first preferred embodiment means through holes of various shapes surrounded on all sides such as a circular hole, an elongated hole, and a square hole. Alternatively, the hollow part may be formed as a cutout surrounded on two sides by the bonding surface 3j such as a slit 21 of a second modification (FIG. 6) described later.

In the first preferred embodiment, the through hole 20 is formed in the electrode terminal 3 as a penetrating hollow part. It is preferable that the through hole 20 be formed as a circular hole or an elongated hole that can be processed easily. In particular, if the through hole 20 is formed as an elongated hole, it is preferable that the long side of the elongated hole be vertical to a direction of ultrasonic vibration. It is preferable that the through hole 20 have a dimension substantially the same as the thickness of the electrode terminal 3 or more. If the thickness of the electrode terminal 3 is 1.0 mm, for example, it is preferable that the through hole 20 as a circular hole have a diameter of 1.0 mm or more and the through hole 20 as an elongated hole have a width of 1.0 mm or more.

The insulating substrate 5 includes the insulating plate 51 and the conductive patterns 52a and 52b formed on opposite surfaces of the insulating plate 51. The insulating plate 51 is an electrical insulator. It is preferable that the insulating plate 51 be made of a material of high heat conductivity. A ceramic plate of a thickness of 0.635 mm or 0.32 mm and made for example of AlN, $Si_3N_4$, or $Al_2O_3$ is generally used as the insulating plate 51. The conductive patterns 52a and 52b are generally made of the same material. The conductive pattern 52a to be bonded to the electrode terminal 3 functions as a wiring member to electrically connect a power semiconductor element and an external circuit. Thus, it is preferable that the conductive pattern 52a be made of metal of low electric resistance. The conductive patterns 52a and 52b are generally made of a material such as Cu or Al of a thickness of 1.0 mm or less, for example.

The heat dissipating member 6 is bonded to one or multiple insulating substrates 5 with the solder 8. The heat dissipating member 6 itself functions as a heat dissipating plate. Additionally, a surface of the heat dissipating member 6 opposite a surface thereof bonded with the solder 8 is connected to a heat sink for example with heat conducting grease. This makes the heat dissipating member 6 dissipate heat efficiently to the outside generated in the power semiconductor device. For this reason, it is preferable that the heat dissipating member 6 be made of metal of high heat conductivity. A plate of a thickness from about 1 to about 5 mm and made of metal such as Cu, Al, or AlSiC is generally used as the heat dissipating member 6.

The solder 8 is used for bonding between the heat dissipating surface side of the insulating substrate 5 and the heat dissipating member 6. For this reason, it is preferable that the solder 8 be made of metal of a low melting point and high heat conductivity. An alloy of metal such as Sn, Pb, Ag, or Cu is generally used as the solder 8. In terms of reliability and heat dissipating performance, it is preferable that the solder 8 have a thickness from about 0.1 to about 0.3 mm.

Manufacturing Method

Figure 3A:
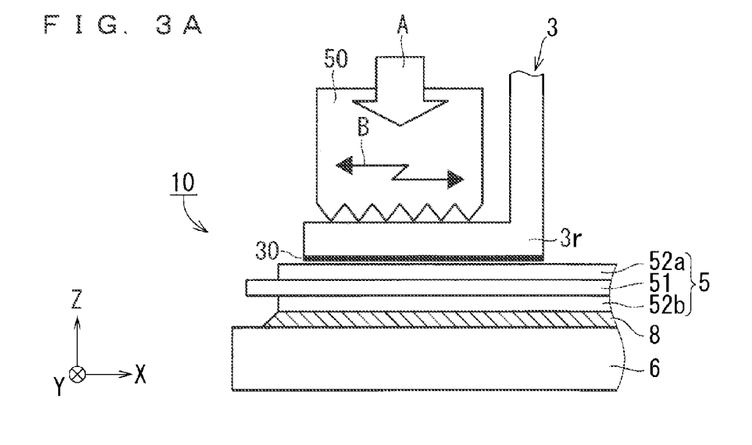
FIGS. 3A, 3B, and 3C show an ultrasonic bonding step for a semiconductor device according to Comparative Example of the present invention.
Figure 3B:
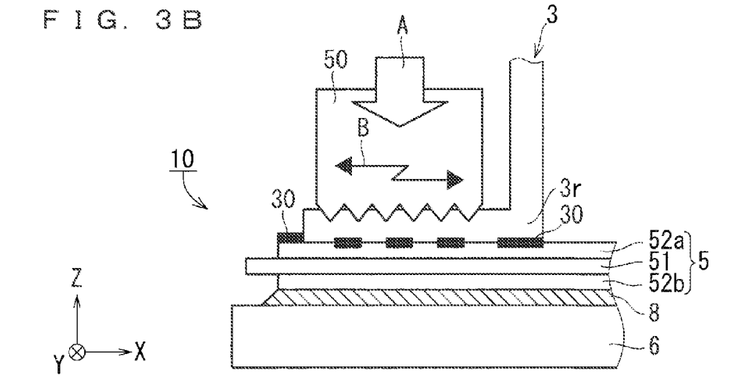
Figure 3C:
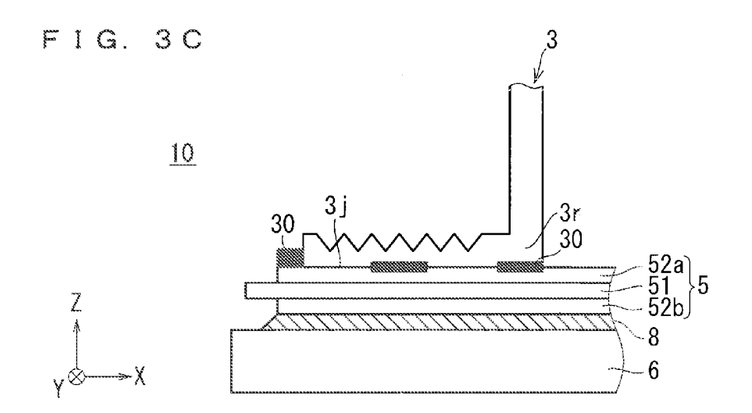
Figure 4A:
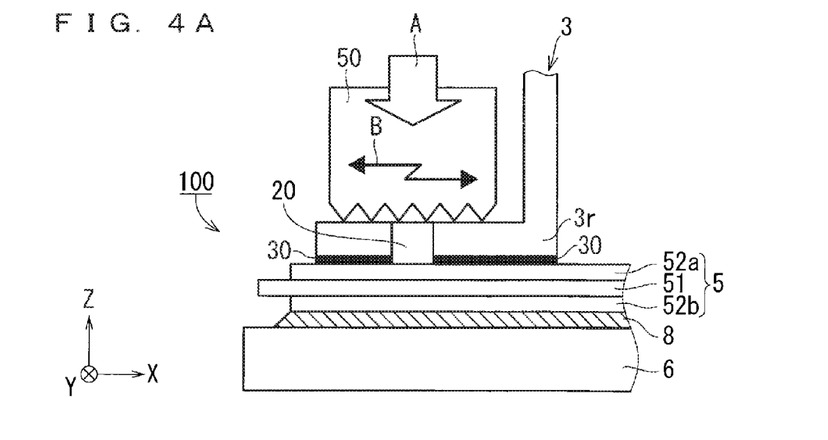
FIGS. 4A, 4B, and 4C show an ultrasonic bonding step for the semiconductor device according to the first preferred embodiment.
Figure 4B:
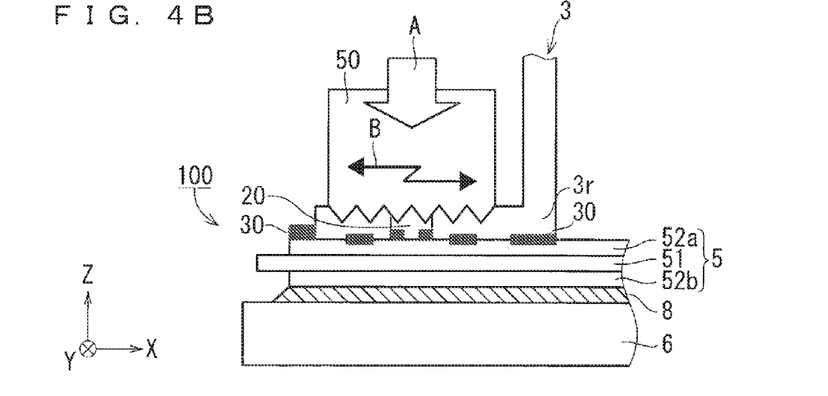
Figure 4C:
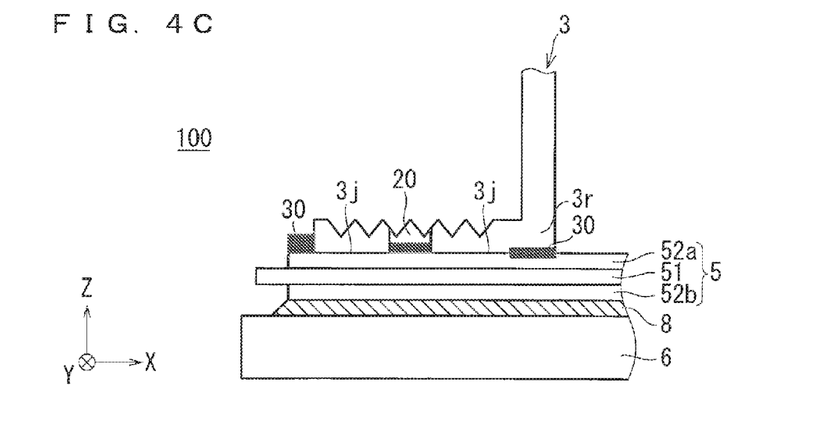

FIGS. 3A, 3B, and 3C show an ultrasonic bonding step for a semiconductor device 10 described as Comparative Example of the first preferred embodiment. FIGS. 4A, 4B, and 4C show an ultrasonic bonding step for the semiconductor device 100 of the first preferred embodiment.

The ultrasonic bonding step for the semiconductor device 10 of Comparative Example is described first by referring to FIGS. 3A, 3B, and 3C. In the semiconductor device 10, an electrode terminal tip of the electrode terminal 3 including the bonding surface 3j is flat. As shown in FIG. 3A, during ultrasonic bonding, while pressure is applied in the direction of an arrow A to a surface of the electrode terminal tip opposite the bonding surface 3j through an ultrasonic horn 50, ultrasonic vibration acting in the directions of arrows B is applied to a bonding target member. At this time, the electrode terminal 3 vibrates on the conductive pattern 52a to break an oxide film 30 covering the surface of the electrode terminal 3 and that of the conductive pattern 52a. This forms direct contact between an intrinsic surface of the electrode terminal 3 and that of the conductive pattern 52a.

When the bonding proceeds further, plastic flow occurs to form coupling on the bonding surface 3j as shown in FIG. 3B, thereby bonding the electrode terminal 3 and the conductive pattern 52a. At this time, as shown in FIG. 3C, the broken oxide film 30 near the outer circumference of the bonding surface 3j is pushed aside to the outside of a bonded part. Thus, favorable bonding performance can be achieved on the outer circumference of the bonded part. Meanwhile, the oxide film 30 in the center and its vicinity of the bonding surface 3j is not pushed aside to the outside of the bonding surface 3j but it remains in the center and its vicinity of the bonding surface 3j. A part of the bonding surface 3j with the remaining oxide film 30 is left unbonded. Thus, bonding is not achieved in the center and its vicinity of the bonding surface 3j.

The ultrasonic bonding step for the semiconductor device 100 of the first preferred embodiment is described next by referring to FIGS. 4A, 4B, and 4C. In the semiconductor device 100, the through hole 20 is formed in advance by mechanical process in the tip of the electrode terminal 3. As shown FIG. 4A, during ultrasonic bonding, while pressure is applied in the direction of an arrow A to a surface of the tip of the electrode terminal 3 opposite the bonding surface 3j through the ultrasonic horn 50, ultrasonic vibration acting in the directions of arrows B is applied to a bonding target member. At this time, the electrode terminal 3 vibrates on the conductive pattern 52a to break the oxide film 30 covering the surface of the electrode terminal 3 and that of the conductive pattern 52a. This forms direct contact between the intrinsic surface of the electrode terminal 3 and that of the conductive pattern 52a.

When the bonding proceeds further, plastic flow occurs to form coupling on the bonding surface 3j as shown in FIG. 4B, thereby bonding the electrode terminal 3 and the conductive pattern 52a. At this time, as shown in FIG. 4C, the broken oxide film 30 near the outer circumference of the bonding surface 3j is pushed aside to the outside of the bonding surface 3j. Thus, favorable bonding performance can be achieved on the outer circumference of the bonding surface 3j. Further, the oxide film 30 in the center and its vicinity of the bonding surface 3j is pushed aside to the inside of the through hole 20. This makes it possible to achieve favorable bonding performance not only on the outer circumference but also in the center of the bonding surface 3j. As a result, sufficient bonding performance is achieved in a small bonding area.

The semiconductor device 10 described as Comparative Example does not enable a check to see whether favorable bonding performance is achieved in the central area of the bonding surface 3j as viewed from an appearance after the bonding. Thus, even if a part of the center of the electrode terminal 3 is left unbonded, this unbonded part cannot be observed after the bonding.

In contrast, in the semiconductor device 100 of the first preferred embodiment, the electrode terminal 3 and the conductive pattern 52a are ultrasonically bonded around the through hole 20 in the electrode terminal 3. This enables observation of the part of the electrode terminal 3 bonded to the conductive pattern 52a through the through hole 20. Forming the through hole 20 in the center of the bonding surface 3j of the electrode terminal 3 enables a cheek to see whether favorable bonding performance is achieved in the center of the bonded part as viewed from an appearance after the bonding. In this regard, it is preferable that the through hole 20 be formed in the central area of the bonding surface 3j of the electrode terminal 3.

First Modification of First Preferred Embodiment

Figure 5:
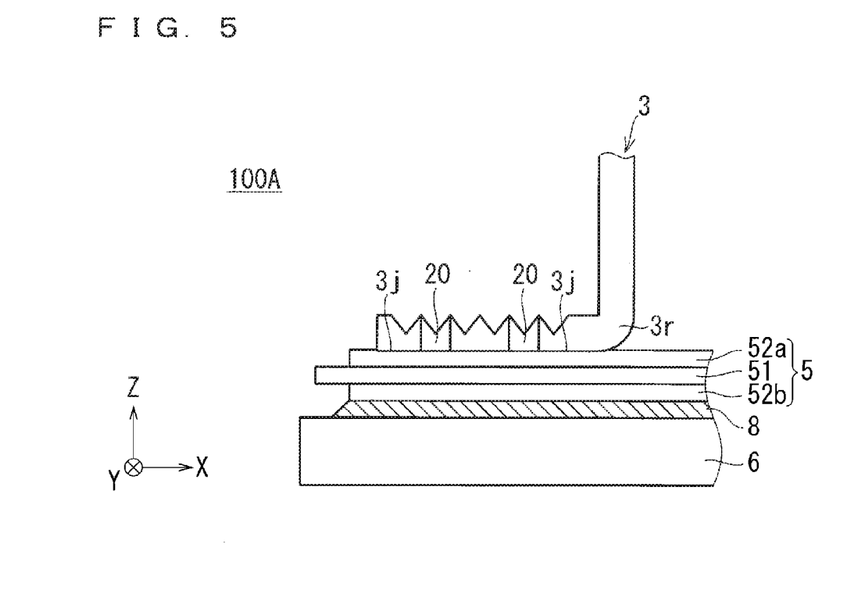
FIG. 5 is a partial sectional view of a semiconductor device according to a first modification of the first preferred embodiment.

FIG. 5 is a partial sectional view of a semiconductor device 100A according to a first modification of the first preferred embodiment. In the semiconductor device 100, one through hole 20 is formed in the bonding surface 3j of the electrode terminal 3. In the semiconductor device 100A, multiple, such as two through holes 20 are formed so as to be surrounded on all sides by the bonding surface 3j of the electrode terminal 3. Forming the multiple through holes 20 in the electrode terminal 3 makes it possible to push the oxide film 30 aside easily to the inside of the through holes 20. Forming the multiple through holes 20 is also preferable in that it can increase a bonded part that can be observed from its appearance through the through holes 20.

In an ultrasonically bonded part, current flows in the direction of the thickness of the electrode terminal 3 through the ultrasonically bonded part. In terms of the structure of a power semiconductor device, heat is dissipated through a path extending in the direction of the thickness of the ultrasonically bonded part. Thus, even in the presence of the through hole 20 in the bonding surface 3j of the electrode terminal 3, an area where current is to flow intensively can be removed or minimized around the through hole 20 if the area of the bonding surface 3j is larger than the sectional area of the electrode terminal 3. This prevents the occurrence of abnormal heating due to intensive flow of current, so that a current amount can be maintained at a level that enables electric conduction. Depending on a current magnitude, heat generated by electric conduction can be reduced by making the tip of the electrode terminal 3 partially or entirely wider than the remaining part of the electrode terminal 3. In this regard, it is preferable that the through hole 20 be formed so as to be surrounded on all sides by the bonding surface 3*j*.

If the through hole 20 is formed only inside the bonding surface 3*j* and the area of the bonding surface 3*j* is larger than the sectional area of the electrode terminal 3, an area where current is to flow intensively can be removed or minimized around the through hole 20. In this case, the highly-reliable semiconductor device 100 responsive to large current can be obtained that enables formation of a bonded part with favorable bonding performance and enables an appearance check to be conducted after bonding to see whether a central area of the electrode terminal 3 is bonded.

Second Modification of First Embodiment

Figure 6:
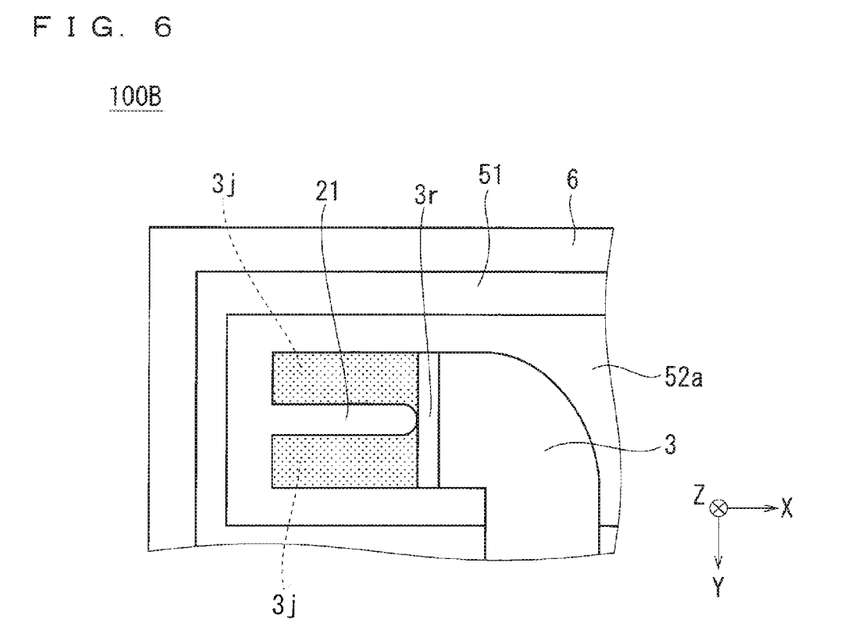
FIG. 6 is a partial sectional view of a semiconductor device according to a second modification of the first preferred embodiment.

FIG. 6 is a partial plan view of a semiconductor device 100B according to a second modification of the first preferred embodiment. The penetrating hollow part in the electrode terminal 3 may be of any shape as long as the shape achieves the aforementioned function (function of removing the oxide film and enabling appearance observation of a bonded part). As an example, the slit 21 extending from the tip toward a terminal bent part 3*r* of the electrode terminal 3 may be formed as the hollow part as shown in FIG. 6. As shown in FIG. 6, the slit 21 is formed so as to be surrounded on two sides by the bonding surface 3*j*. The slit 21 may be shortened to make a root of the slit 21 contact the bonding surface 3*j*. In this case, the slit 21 is to be surrounded on three sides by the bonding surface 3*j*.

Forming the slit 21 as the hollow part can divide the bonding surface 3*j* into two. Thus, even if stress is applied repeatedly to a bonded part as a result of a temperature cycle or the like to cause a crack in one of the bonding surfaces 3*j*, the other bonding surface 3*j* in a bonded state prevents the electrode terminal 3 from peeling off the conductive pattern 52*a*, thereby preventing formation of an open circuit. This can reduce nonuniformity of the reliability of the entire bonded part, thereby enhancing the reliability of the semiconductor device 100.

Like in the case of FIG. 5, the number of the slits 21 is not limited to one but multiple slits 21 may be provided. Providing more slits can increase the number of the divided bonding surfaces 3*j*. This allows the oxide film 30 to be pushed aside to the outside of the bonding surfaces 3*j* easily. Increasing the number of the divided bonding surfaces 3*j* is also preferable in terms of reducing nonuniformity of the reliability of the entire bonded part.

For ultrasonic bonding of the electrode terminal 3, bonding the electrode terminal 3 in units of the bonding surfaces 3*j* divided by the slit 21 causes the risk of a crack at the root of the slit 21 due to vibration applied during the bonding. Thus, it is preferable that the multiple bonding surfaces 3*j* divided by the slit 21 be bonded simultaneously. It is further preferable that the hollow part (specifically, slit 21) be provided only in an area to be surrounded on at least two sides by the bonding surface 3*j*.

Effects

The semiconductor device 100 of the first preferred embodiment includes a bonding target (specifically, conductive pattern 52*a*) and the electrode terminal 3 bonded to the bonding target. The electrode terminal 3 and the bonding target are bonded by ultrasonic bonding at the bonding surface 30*j* to be subjected to bonding. The electrode terminal 3 includes the penetrating hollow part (specifically, through hole 20) surrounded on at least two sides by the bonding surface 3*j*.

In the semiconductor device 100, the electrode terminal 3 includes the through hole 20 formed in advance as the penetrating hollow part so as to be surrounded on all sides by the bonding surface 3*j* of the electrode terminal 3 with the conductive pattern 52*a*. Thus, the oxide film 30 on the surface of the bonding surface 3*j* broken during the ultrasonic bonding is pushed aside to the inside of the through hole 20 without remaining in the center of the bonding surface 30*j*. This achieves favorable bonding performance not only on the outer circumference but also in the center of the bonded part. Specifically, the electrode terminal 3 and the conductive pattern 52*a* can be bonded firmly.

Further, in the semiconductor device 100, the bonded part of the electrode terminal 3 and the conductive pattern 52*a* can be observed from outside through the through hole 20. Forming the through hole 20 in the center of the bonding surface 3*j* enables a check to see whether favorable bonding performance is achieved in the center of the bonded part as viewed from the appearance of the bonded part.

In the semiconductor device 100 of the first preferred embodiment, the hollow part of the electrode terminal 3 includes at least one through hole 20 surrounded on all sides by the bonding surface 3*j*.

The through hole 20 is provided as the hollow part in the electrode terminal 3. Thus, the hollow part can be formed easily in the step of forming the hollow part in the electrode terminal 3.

In the semiconductor device 100 of the first preferred embodiment, the electrode terminal 3 includes the hollow part provided only in an area to be surrounded on at least two sides by the bonding surface 3*j*.

If the hollow part is provided only in an area to be surrounded on at least two sides by the bonding surface 3*j* and if the area of the bonding surface 3*j* is larger than the sectional area of the electrode terminal 3, an area where current is to flow intensively can be removed or minimized even around the hollow part. Providing the hollow part achieves favorable bonding performance and enables an appearance check to be conducted after bonding to see whether a central area of the electrode terminal 3 is bonded. As a result, the highly-reliable semiconductor device 100 for power applications responsive to large current can be obtained.

The semiconductor device 100 of the first preferred embodiment further includes the insulating substrate 5 with the insulating plate 51 and the conductive pattern 52*a* formed on the surface of the insulating plate 51. The bonding target is the conductive pattern 52*a*.

Even if the electrode terminal 3 generates heat in response current flow in the electrode terminal 3 to apply stress repeatedly to the bonded part, firm bonding between the electrode terminal 3 and the conductive pattern 52*a* still makes it possible to obtain the highly-reliable semiconductor device 100.

A method of manufacturing the semiconductor device 100 of the first preferred embodiment includes the steps of: forming the hollow part by making a part of the electrode terminal 3 hollow; fixing the bonding target to an ultrasonic bonding machine; placing the electrode terminal 3 with the hollow part on the bonding target; making an ultrasonic horn 50 of the ultrasonic bonding machine abut on the electrode terminal 3 on a side opposite the bonding surface 3j of the electrode terminal 3 and bonding the electrode terminal 3 and the bonding target by ultrasonic bonding such that the hollow part is surrounded on at least two sides by the bonding surface 3j.

In the first preferred embodiment, before the electrode terminal 3 is ultrasonically bonded to the bonding target, the penetrating hollow part is provided in advance in a part of the electrode terminal 3 to be bonded. By providing the hollow part in advance, an oxide film is pushed aside to the inside of the hollow part during the ultrasonic bonding. This restrains the oxide film from remaining on the bonding surface 3j, thereby enabling firm bonding.

After the ultrasonic bonding, the bonded part of the electrode terminal 3 and the bonding target can be observed from outside through the through hole 20. Forming the through hole 20 in the center of the bonding surface 3j enables a check to see whether favorable bonding performance is achieved in the center of the bonded part as viewed from the appearance of the bonded part.

In the semiconductor device 100A of the first modification of the first preferred embodiment, at least one through hole 20 includes a plurality of through holes 20.

Forming a plurality of through holes 20 in the electrode terminal 3 makes it possible to push the oxide film 30 aside easily to the inside of the through holes 20. Forming a plurality of through holes 20 is also preferable in that it increases a bonded part that can be observed from its appearance through the through holes 20.

In the semiconductor device 100B of the second modification of the first preferred embodiment, the hollow part of the electrode terminal 3 includes at least one slit 21 surrounded on two or three sides by the bonding surface 3j.

Forming the slit 21 as the hollow part can divide the bonding surface 3j. Thus, even if stress is applied repeatedly to the bonded part as a result of a temperature cycle or the like to cause a crack in one of the bonding surfaces 3j, the other bonding surface 3j in a bonded state prevents the electrode terminal 3 from peeling off the conductive pattern 52a, thereby preventing formation of an open circuit. This can reduce nonuniformity of the reliability of the entire bonded part, thereby enhancing the reliability of the semiconductor device 100.

Second Preferred Embodiment

Figure 7:
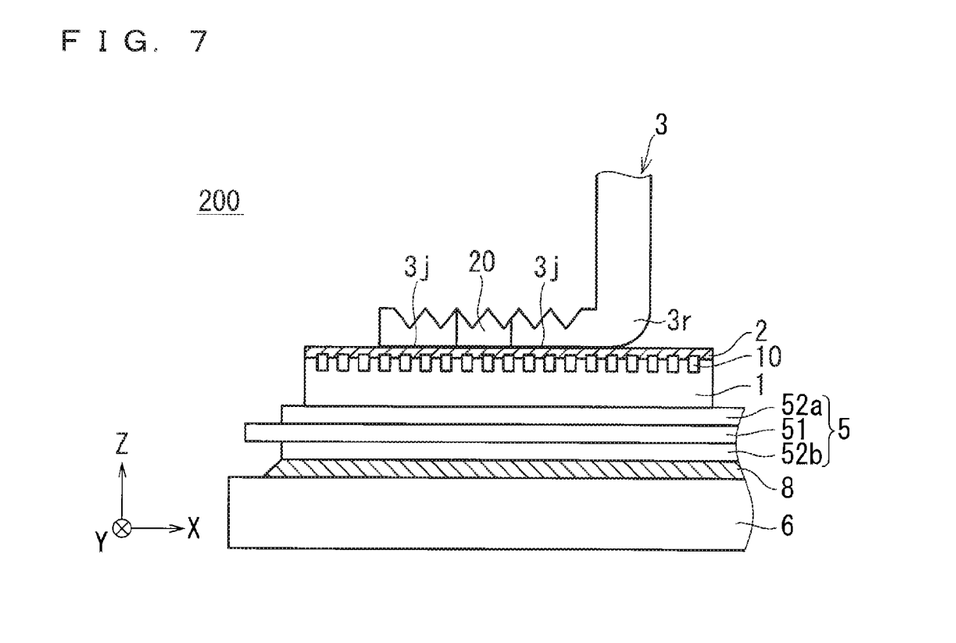
FIG. 7 is a partial sectional view of a semiconductor device according to a second preferred embodiment.

FIG. 7 is a partial sectional view of a semiconductor device 200 according to a second preferred embodiment. The second preferred embodiment and the first preferred embodiment (FIGS. 1 and 2) differ from each other in that in the second preferred embodiment, the electrode terminal 3 is bonded to a main electrode (specifically, surface electrode 2) formed on a surface of a power semiconductor element 1 instead of being bonded to the conductive pattern 52a. Like in the first preferred embodiment, a hollow part is formed in the electrode terminal 3 of the semiconductor device 200. In the second preferred embodiment, the hollow part is the through hole 20 surrounded on all sides by the bonding surface 3j.

In the second preferred embodiment, the surface electrode 2 formed on the surface of the semiconductor element 1 and the electrode terminal 3 are ultrasonically bonded. Transistors 10 are formed below the surface electrode 2. A surface of the power semiconductor element 1 opposite to the surface thereof on which the surface electrode 2 is formed is bonded on the conductive pattern 52a of the insulating substrate 5 with solder.

The semiconductor element 1 is a power semiconductor element forming an inverter or a converter. The semiconductor device 200 of the second preferred embodiment is only required to include at least one or more semiconductor elements 1. Meanwhile, it is preferable that the semiconductor device 200 include an IGBT or an MOSFET connected in antiparallel to a diode. The semiconductor element 1 is made of Si, SiC, or GaN, for example. Meanwhile, using SiC reduces the area of the surface electrode 2 relative to a rated current of a chip compared to using Si. Thus, using SiC requires higher density wiring technique than using Si. For this reason, in a power semiconductor device using SiC, ultrasonically bonding the electrode terminal 3 to the surface electrode 2 achieves the advantage of the present invention of forming a large area bonded part by one bonding more effectively. The semiconductor element 1 of the second preferred embodiment is made of Si and has a rated voltage and a rated current of 1400 V and 175 A respectively. The semiconductor element 1 is 15 mm×15 mm in size and 15 mm in thickness.

The surface electrode 2 is a metal film for wiring of an electrode formed on the surface of the semiconductor element 1. The surface electrode 2 is generally made of Al. Alternatively, the surface electrode 2 is made of an Al alloy, Cu, or a Cu alloy, for example. In some cases, the surface electrode 2 is formed by stacking metals such as Ti, Mo, Ni, and Au, for example. All of these materials achieve comparable effects. The surface electrode 2 of the second preferred embodiment is made of Al of a thickness of 0.07 mm.

The semiconductor device 200 of the second preferred embodiment and a semiconductor device without a hollow part in the electrode terminal 3 are compared. As described in the first preferred embodiment by referring to FIGS. 3A to 3C, if the electrode terminal 3 without a hollow part is ultrasonically bonded, the oxide film 30 in the center and its vicinity of the bonding surface 3j is not pushed aside to the outside of the bonding surface 3j but it remains in the bonding surface 3j. A part of the bonding surface 3j with the remaining oxide film 30 is left unbonded. This unbonded part remains in the center of the bonding surface 3j.

In the first preferred embodiment, heat generated by the electrode terminal 3 in response to current flow in the electrode terminal 3 becomes a main cause for stress to be applied repeatedly to a bonded part. In the second preferred embodiment, as a result of heat additionally generated by the semiconductor element 1, stress larger than that of the first preferred embodiment is applied repeatedly to the bonded part.

In the semiconductor device without a hollow part in the electrode terminal 3, to reduce the oxide film 30 remaining in the center of the bonding surface 3j during ultrasonic bonding, the amplitude of ultrasonic vibration to be applied through the ultrasonic horn 50 should be increased during the bonding. Meanwhile, increasing the amplitude deforms the electrode terminal 3 and the surface electrode 2 more seriously as a result of pressure and the ultrasonic vibration applied through the ultrasonic horn 50. This pushes the surface electrode 2 aside together with the oxide film 30 to break the transistors 10 formed below the surface electrode 2. If the deformation becomes more seriously, the electrode terminal 3 collide with the semiconductor element 1 to break the semiconductor element 1.

As described above, in the semiconductor device 200 of the second preferred embodiment, the through hole 20 is formed in advance as a hollow part in a part of the electrode terminal 3 bonded to the surface electrode 2 so as to be surrounded on all sides by the bonding surface 3*j*.

In the semiconductor device 200 of the second preferred embodiment, the electrode terminal 3 including the through hole 20 formed in advance as a hollow part in the bonding surface 3*j* is ultrasonically bonded to the surface electrode 2 formed on the surface of the power semiconductor element 1. This achieves the advantage of the first preferred embodiment more effectively. Further, deformation of the surface electrode 2 to be caused by pressure and ultrasonic vibration applied through the ultrasonic horn 50 is suppressed, thereby advantageously preventing the transistors 10 and the power semiconductor element 1 below the surface electrode 2 from being broken.

Effects

The semiconductor device 200 of the second preferred embodiment further includes the insulating substrate 5 with the insulating plate 51 and the conductive pattern 52*a* formed on the surface of the insulating plate 51, and the semiconductor element 1 connected to the conductive pattern 52*a*. A bonding target is the main electrode (specifically, surface electrode 2) of the semiconductor element 1.

Even if the amplitude of the ultrasonic horn 50 is small, the oxide film 30 on the bonding surface 3*j* does not remain in the center of a bonded part but it is pushed aside to the inside of the hollow part (specifically, through hole 20) during ultrasonic bonding. Specifically, favorable bonding performance can be achieved not only on the outer circumference but also in the center of the bonding surface 3*j*. The second preferred embodiment can suppress deformation of the surface electrode 2 to be caused by pressure and ultrasonic vibration applied through the ultrasonic horn 50 during ultrasonic bonding. The second preferred embodiment can also prevent the transistors 10 and the power semiconductor element 1 below the surface electrode 2 from being broken.

The preferred embodiments of the present invention can be combined freely within the scope of the invention. Further, each of the preferred embodiments can be changed or omitted, where appropriate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   a bonding target; and
   an electrode terminal bonded to said bonding target, wherein
   said electrode terminal and said bonding target are bonded by ultrasonic bonding at a bonding surface to be subjected to bonding,
   said electrode terminal includes a penetrating hollow part, and
   at least three sides of said penetrating hollow part are adjacently in contact with said bonding surface.

2. The semiconductor device according to claim 1, wherein said hollow part of said electrode terminal includes at least one through hole, and
   all sides of said through hole are adjacently in contact with said bonding surface.

3. The semiconductor device according to claim 2, wherein said at least one through hole includes a plurality of through holes.

4. The semiconductor device according to claim 1, wherein said hollow part of said electrode terminal includes at least one slit, and
   at least three sides of said slit are adjacently in contact with said bonding surface.

5. The semiconductor device according to claim 1, wherein said hollow part of said electrode terminal is provided only in an area, and
   at least three sides of said area are adjacently in contact with said bonding surface.

6. The semiconductor device according to claim 1, further comprising
   an insulating substrate with an insulating plate and a conductive pattern formed on a surface of said insulating plate,
   wherein said bonding target is said conductive pattern.

7. The semiconductor device according to claim 1, further comprising:
   an insulating substrate with an insulating plate and a conductive pattern formed on a surface of said insulating plate; and
   a semiconductor element connected to said conductive pattern,
   wherein said bonding target is a main electrode of said semiconductor element.

8. A method of manufacturing the semiconductor device as recited in claim 1, comprising the steps of:
   forming said hollow part by making a part of said electrode terminal hollow;
   fixing said bonding target to an ultrasonic bonding machine;
   placing said electrode terminal with said hollow part on said bonding target; and
   making a horn of said ultrasonic bonding machine abut on said electrode terminal on a side opposite said bonding surface of said electrode terminal and bonding said electrode terminal and said bonding target by ultrasonic bonding only once such that at least two sides of said hollow part are adjacently in contact with said bonding surface.

9. A semiconductor device comprising:
   a bonding target; and
   an electrode terminal bonded to said bonding target, wherein
   said electrode terminal and said bonding target are bonded by ultrasonic bonding at a bonding surface to be subjected to bonding,
   said electrode terminal includes a penetrating hollow part,
   at least two sides of said penetrating hollow part are adjacently in contact with said bonding surface,
   said hollow part of said electrode terminal includes at least one through hole, and
   all sides of said through hole are adjacently in contact with said bonding surface.

\* \* \* \* \*